(12) United States Patent
Stoffels et al.

(10) Patent No.: US 11,664,223 B2
(45) Date of Patent: May 30, 2023

(54) METHOD FOR MANUFACTURING A VERTICAL POWER DEVICE INCLUDING AN III-NITRIDE SEMICONDUCTOR STRUCTURE

(71) Applicant: IMEC VZW, Leuven (BE)

(72) Inventors: Steve Stoffels, Haasrode (BE); Hu Liang, Leuven (BE)

(73) Assignee: Imec vzw, Leuven (BE)

( * ) Notice: Subject to any disclaimer, the term of this patent is extended or adjusted under 35 U.S.C. 154(b) by 212 days.

(21) Appl. No.: 17/062,192

(22) Filed: Oct. 2, 2020

(65) Prior Publication Data
US 2021/0118680 A1 Apr. 22, 2021

(30) Foreign Application Priority Data

Oct. 22, 2019 (EP) ..................................... 19204534

(51) Int. Cl.
*H01L 21/02* (2006.01)

(52) U.S. Cl.
CPC .... *H01L 21/02639* (2013.01); *H01L 21/0254* (2013.01); *H01L 21/02458* (2013.01);
(Continued)

(58) Field of Classification Search
CPC ......... H01L 21/02639; H01L 21/02458; H01L 21/0254; H01L 21/02576; H01L 21/02598;
(Continued)

(56) References Cited

U.S. PATENT DOCUMENTS 6,252,261 B1 6/2001 Usui et al.
8,044,434 B2 10/2011 Ohta et al.
(Continued)

FOREIGN PATENT DOCUMENTS

| JP | 2005142415 A | 6/2005 |
|---|---|---|
| KR | 100455277 B1 | 9/2000 |
| KR | 100860709 B1 | 9/2008 |

OTHER PUBLICATIONS

Gibart, P., et al., "Chapter 2. Epitaxial Lateral Overgrowth of GaN", in Nitride Semiconductors: Handbook on Materials and Devices, (P. Ruterana, et al., editors), Wiley-VCH Verlag GmbH & Co. KGaA, Weinheim, 2003, pp. 45-106.
(Continued)

*Primary Examiner* — Duy T Nguyen
(74) *Attorney, Agent, or Firm* — McDonnell Boehnen Hulbert & Berghoff LLP

(57) ABSTRACT

A method for manufacturing an III-nitride semiconductor structure is provided. The method includes providing a substrate comprising a first layer having an upper surface of monocrystalline III-nitride material; providing, over the upper surface, a patterned dielectric layer comprising a first dielectric feature; loading the substrate into a process chamber; exposing the substrate to a first gas mixture comprising at least one Group III-metal organic precursor gas, a nitrogen containing gas and hydrogen gas at a predetermined temperature, thereby forming, on the upper surface, a second layer of a monocrystalline III-nitride material by area selective growth wherein two opposing sidewalls of the dielectric feature are oriented parallel to one of the {11-20} crystal planes of the first layer such that upon formation of the second layer of the monocrystalline III-nitride material, a first trench having tapered sidewalls is formed so that the
(Continued)

crystal plane of the second layer parallel to the tapered sidewalls is one of the {1-101} crystal planes.

16 Claims, 5 Drawing Sheets

(52) U.S. Cl.
CPC .. *H01L 21/02576* (2013.01); *H01L 21/02598* (2013.01); *H01L 21/02609* (2013.01)

(58) Field of Classification Search
CPC .......... H01L 21/02609; H01L 21/0245; H01L 21/02488; H01L 21/02505; H01L 21/02516; H01L 21/0262; H01L 21/30621; H01L 21/3083
USPC ........................................................ 438/479
See application file for complete search history.

(56) References Cited

U.S. PATENT DOCUMENTS

| | | | |
|---|---|---|---|
| 8,729,562 B2 | 5/2014 | Okada et al. | |
| 9,865,725 B2 | 1/2018 | Chu | |
| 2006/0172512 A1* | 8/2006 | Hiramatsu | ........ H01L 21/02389 438/483 |
| 2009/0087994 A1* | 4/2009 | Lee | ................... H01L 21/30617 438/704 |
| 2014/0045306 A1 | 2/2014 | Bour et al. | |
| 2014/0203329 A1 | 7/2014 | Saitoh et al. | |
| 2015/0375992 A1* | 12/2015 | Chou | .................. B81C 1/00238 257/415 |
| 2018/0190789 A1 | 7/2018 | Bour et al. | |

OTHER PUBLICATIONS

Zheleva, Tsvetanka S., et al., "Lateral Expitaxy and Dislocation Density Reduction in Selectively Grown GaN Structures", Journal of Crystal Growth, Jan. 1, 2001, vol. 222, pp. 706-718.

Zhang, Y., et al., "Trench Formation and Corner Rounding in Vertical GaN Power Devices", Appl. Phys. Lett., 2017, vol. 110, pp. 193506-1 to 193506-5.

Extended European Search Report, from the European Patent Office for EP19204534, dated Jul. 31, 2020, pp. 1-12.

* cited by examiner (a)

(b)

METHOD FOR MANUFACTURING A VERTICAL POWER DEVICE INCLUDING AN III-NITRIDE SEMICONDUCTOR STRUCTURE

CROSS-REFERENCE

This application claims priority from European Patent application no. 19204534.2, filed Oct. 22, 2019, which is incorporated by reference in its entirety.

TECHNICAL FIELD OF THE DISCLOSURE

The present disclosure relates to a method of manufacturing an III-nitride semiconductor structure.

BACKGROUND OF THE DISCLOSURE

III-nitride semiconductor structures are interesting particularly for the manufacturing of III-nitride devices such as power devices, Light Emitting Diodes (LEDs) and enhancement mode devices that are based on GaN technology.

The active layers in an epitaxial stack for GaN based power devices, particularly for vertical GaN devices, can consist of a buried n+ contact for formation of the bottom electrode (drain), a n− drift region, a p-body region and a top n+ region for formation of the top electrode (source). The gate of a vertical device can be formed by performing a trench recess process, etching through the top n+ and p-body region, stopping in the drift region. This recess can be a very important step in the process, as the gate of the device can be formed on the sidewall of the trench which can be formed by this recess. Typically, for the trench-based devices a metal-insulator-semiconductor (MIS) gate can be formed on the sidewall of the gate recess. The gate recess can typically be performed with a plasma etch process. This plasma etch process is known to create damage in the GaN layer, which is not trivial to restore.

Another issue is that for vertical GaN devices, forming a p-contact towards the p-body layer may be required. The p-body layer can be buried, therefore during p-contact formation a recess can needed towards the p-body. This recess can typically also be done with a plasma process, which can be damaging for the surface and can make it difficult to form a good ohmic-contact toward the p-body layer.

Therefore, there is a need in the art for a method to manufacture III-nitride semiconductor structures that can form a damage poor gate recess and/or a damage poor p-contact recess for vertical GaN devices.

SUMMARY OF THE DISCLOSURE

It is an object of the present disclosure to provide methods for obtaining a III-nitride semiconductor structure having an exposed III-nitride surface with low interface defect density and low density of dangling bonds.

The above objective can be accomplished by the method according to the present disclosure.

In some embodiments of the present disclosure, the method can allow for manufacturing vertical power devices having gate stability and mobility in the channel.

In some embodiments of the present disclosure, the method can allow for manufacturing vertical power devices with low interface defect density and lower density of dangling bonds in the gate trench and/or p-contact trench. More beneficially, the embodiments of the present disclosure can allow damage-poor growth of the sidewall of channel of the vertical power device.

In some the embodiments of the present disclosure, the method can allow for manufacturing vertical power devices without premature breakdown. The breakdown of the device can be dependent on the doping concentration in the drift region. Therefore, premature breakdown can happen if the doping concentration in the drift region is altered due to the process, which can be avoided as a benefit of the embodiments of the present disclosure.

It some embodiments of the present disclosure, the method can allow for increasing manufacturing throughput in the manufacturing of vertical power devices, thanks to the decreased number of process steps.

In a first aspect, the present disclosure relates to a method for manufacturing an III-nitride semiconductor structure. The method comprising:
providing a substrate comprising a first layer having an upper surface of monocrystalline III-nitride material;
providing, over the upper surface, a patterned dielectric layer comprising a first dielectric feature;
loading the substrate into a process chamber; and
exposing the substrate to a first gas mixture comprising at least one Group III-metal organic precursor gas, a nitrogen containing gas and hydrogen gas at a predetermined temperature, thereby forming, on the upper surface, a second layer of a monocrystalline III-nitride material by area selective growth wherein two opposing sidewalls of the dielectric feature are oriented parallel to one of the {11-20} crystal planes of the first layer such that upon formation of the second layer of the monocrystalline III-nitride material a first trench having tapered sidewalls is formed so that the crystal plane of the second layer parallel to the tapered sidewalls is one of the {1-101} crystal planes.

In a second aspect, the present disclosure relates to a method for manufacturing an III-nitride semiconductor structure. The method comprising:
providing a substrate comprising a first layer having an upper surface of monocrystalline III-nitride material;
providing, on the upper surface, a patterned dielectric layer comprising a second opening, the second opening exposing, at its bottom, a part of the upper surface;
loading the substrate into a process chamber;
exposing the substrate to a second gas mixture comprising a nitrogen containing gas and hydrogen gas at a predetermined temperature, thereby removing a part of the layer exposed through the second opening, wherein two opposing sidewalls of the second opening are oriented parallel to one of the {11-20} crystal plane of the first layer such that upon exposure to the second gas mixture the layer is removed through the second opening, thereby forming a fourth trench with tapered sidewalls so that the crystal orientation parallel to the tapered sidewalls is one of the {1-101} planes.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and benefits of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF DRAWINGS

FIG. 2, parts a and b, show a schematic representation of process steps, in order, as used in an embodiment of the first aspect of the present disclosure. FIG. 2, part c, the third layer is a plurality of monocrystalline III-nitride material (335).

FIG. 3, part a, is a tilted cross section image, while FIG. 3, part b, is a cross section image.

FIG. 5, part a, shows that the vertical device may further comprise halting the formation of the third layer (85) of the monocrystalline III-nitride material. FIG. 5, part b, shows a third patterned dielectric feature (14) may be provided on an exposed intermediate layer (85) before resuming the formation of the layer of the monocrystalline III-nitride material as shown. FIG. 5, part c, shows the resuming the formation of the layer of the monocrystalline III-nitride material which leads to the creation of another trench in the same vertical power device.

FIG. 6, part a, shows a patterned dielectric layer (11) provided on an upper surface. FIG. 6, part b, shows a trench (95) which may represent a gate trench. FIG. 6, part c, shows a trench (96) which may represent a p-contact trench.

FIG. 8, part a, shows that before loading the substrate into the process chamber, partial etching may be performed through the second opening (12). This helps to remove some of the material, thereby partially recessing the first layer, leading to the formation of trench (12'), whereby no change is made to the width w1 of the second opening (12). FIG. 8, part b, shows formation of a fourth opening (15) on the patterned dielectric layer having a width w3. This width w3 of the fourth opening (15) may be the same or different than the width w1 of the second opening (12). FIG. 8, part c, shows that even in embodiments where width w3 would be the same as the width w1, due to the prior partial etching done, the final depth of the trenches obtained (95', 96) can be different.

FIG. 9, part a, shows that once the two sidewalls meet, the removal process will naturally stop. FIG. 9, part b, shows that when the removal process is performed, the method may further comprise performing a wet etch process comprising tetramethylammonium hydroxide (TMAH), thereby making the tapered sidewalls substantially perpendicular (82') with respect to the upper surface.

DETAILED DESCRIPTION OF THE DISCLOSURE

Figure 1:
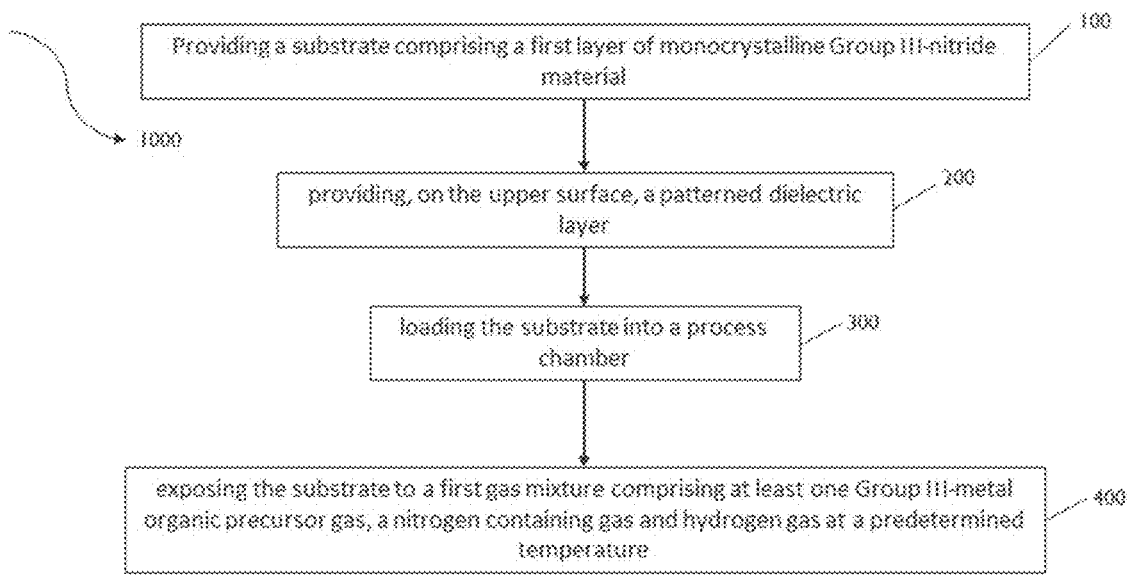
FIG. 1: is a flowchart representing a method according to a first aspect of the present disclosure.

The present disclosure will be described with respect to particular embodiments and with reference to certain drawings, but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, over, under and the like in the description and the claims are used for descriptive purposes and not necessarily for describing relative positions. It is to be understood that the terms so used are interchangeable with their antonyms under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various disclosed aspects. This method of disclosure, however, is not to be interpreted as reflecting an intention that the claimed disclosure requires more features than are expressly recited in each claim. Rather, as the following claims reflect, disclosed aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some, but not other features included in other embodiments, combinations of features of different embodiments are meant to be within the scope of the disclosure, and form different embodiments, as would be understood by those skilled in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

The following terms are provided solely to aid in the understanding of the disclosure.

As used herein and unless provided otherwise, the term "stability of the device" refers to the fact that the device characteristics ($V_t$, $R_{on}$, leakage) do not significantly drift when applying a bias voltage on the gate for a certain duration.

As used herein and unless provided otherwise, the term "premature breakdown" refers to the breakdown of the device in the off-state (i.e. a gate bias is applied such that the device is switched off and a drain bias VDS is applied between source and drain). The off-state breakdown can be, amongst others, dependent on the doping concentration in the drift region. Premature breakdown could happen if the doping concentration in the drift region is altered from its as-grown value due to the process applied, for example due to etch damage or in-diffusion of additional impurities.

As used herein and unless provided otherwise, the phrase "chemical nature remains substantially the same" within the context of the doping level means that the doping concentration is not significantly altered by the applied process with respect to the as-grown reference value, for example due to etch damage, in diffusion of additional impurities.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

Figure 2:
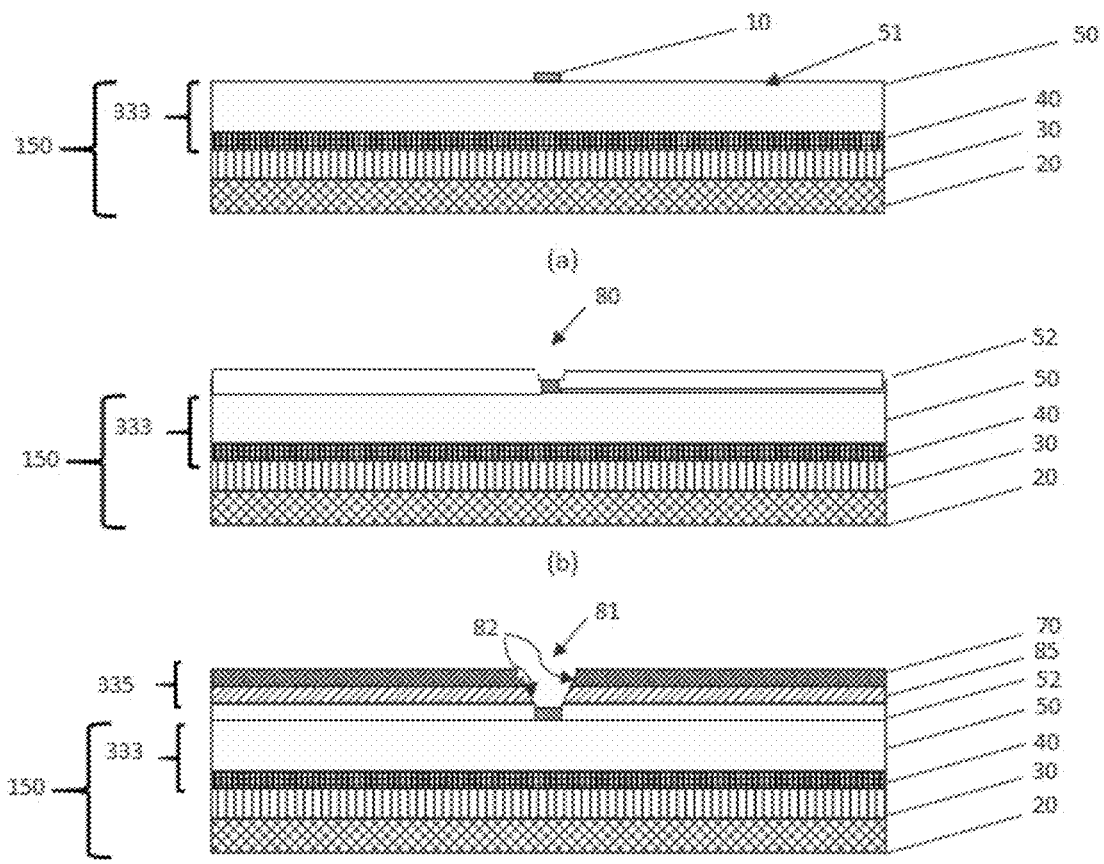
FIG. 2, parts a to c: show a schematic representation of process steps, in order, as used in an embodiment of the first aspect of the present disclosure.

Referring now to FIG. 1, a flowchart is shown which represent a method (1000) according to a first aspect of the present disclosure and FIG. 2, parts a and b, showing a schematic representation of process steps, in order, as used in an embodiment of the first aspect of the present disclosure.

The method (1000) comprises providing (100) a substrate (150) comprising a first layer (333) having an upper surface (51) of monocrystalline III-nitride material. This upper surface may be exposed to the ambient, the ambient being the inside of a process chamber or inside of an enclosed space.

In embodiments, the substrate (150) may comprise a semiconductor layer. In some embodiments, the substrate (150) may comprise a Si layer (20). In other embodiments, the substrate (150) may comprise a <111> oriented Si layer. In yet other embodiments, the substrate may be an engineered substrate comprising the semiconductor layer. In such embodiments, the engineered substrate may comprise a poly AlN covered with an oxide layer. The Si layer may cover this oxide layer. In some embodiments, this Si layer can be a <111> oriented Si layer. Such an engineered substrate can be beneficial especially when the method is used for the manufacturing of III-nitride semiconductor structures to be used for the manufacturing of vertical power devices. The benefit may lie in the fact that such an engineered substrate can allow for growing thicker layers of epitaxial stack, which can be beneficial for vertical power devices.

In embodiments, the first layer (50) may be a single layer.

In embodiments, this monocrystalline III-nitride material of the first layer (50) may be a binary, ternary or quaternary III-nitride material. In some embodiments, this monocrystalline III-nitride material may be GaN.

In embodiments, the first layer (50) may be doped. The doping may constitute an n-type doping provided at a doping level ranging from 5e15 to 1e19 $cm^{-3}$.

In embodiments, the first layer may be a stack of layers (333) stacked horizontally on top of each other and comprised in the substrate. In embodiments, some of these layers in this stack of layers may be a layer of a monocrystalline III-nitride material.

In these embodiments, the monocrystalline III-nitride material in this stack of layers may be a binary, ternary or quaternary III-nitride material.

In these embodiments, the monocrystalline III-nitride material in this stack of layers may be the same material as one another or different from one another. In other embodiments, the layer of monocrystalline III-nitride material in this stack of layers may be GaN.

In embodiments, some or all of the layers of this layer stack may be doped. In such embodiments, the doping type may be the same in each layer of this stack of layers. In some embodiments, this doping type may be an n-type doping. As far as the doping level of the n-type doping is concerned, in embodiments, it may be different from one another in the layers of this stack.

In yet other embodiments, this first layer (50) can be doped with an n-type dopant at a level ranging from 1e15 to 5e16 $cm^{-3}$ underneath this layer and there may be another layer (40) of a III-nitride material doped still with an n-type doping at a level ranging from 1e18 to 5e19 $cm^{-3}$.

In exemplary embodiments, where the first layer is a stack of layers (333), these layers, going from top to bottom, as in FIG. 2, part a, may be a n-type doped GaN layer (50) at a doping level ranging from 5e15 to 1e 17 $cm^{-3}$, and another n-type doped GaN layer (40) at a doping level ranging from 1e18 to 1e19 $cm^{-3}$. There may also be an interlayer (30) comprised in the substrate (150) for stress compensation with the stack of layers.

As seen further from FIG. 1 and FIG. 2, part a, a patterned dielectric layer may be provided (200) over the upper surface (51). This patterned dielectric layer comprises a first dielectric feature (10).

In some embodiments, this patterned dielectric layer may be provided on and in contact with the upper surface (51).

In embodiments, the provision of this patterned dielectric layer may comprise providing a dielectric layer over the upper surface (51). A patterning process may be performed to form the first patterned dielectric feature (10). This patterning process may comprise an etch process.

It may also be a gap-fill like process involving filling of a gap, which may be made in a patterned masking layer, by a dielectric material, followed by removal of the patterned masking layer, thereby obtaining the patterned dielectric layer.

In some embodiments, the provision of this patterned dielectric layer may comprise providing a dielectric layer on and in contact with the upper surface.

The dielectric layer may be chosen such that the chemical nature of the first layer (50) of monocrystalline III-nitride material is unaffected by the dielectric layer when the substrate (150) undergoes a temperature driven process so that a doping level of the first layer of monocrystalline III-nitride material remains substantially the same.

A change of chemical nature of the first layer (50, 60) of monocrystalline III-nitride material can happen if, for example, diffusion of dopants or elements occur from or to the first layer. Since diffusion can be driven by temperature, an increase in temperature when the substrate is subjected to a temperature driven process may trigger this kind of diffusion process. A temperature driven process may include a thermal treatment process, whereby the substrate may be subjected to temperature by a process, such as annealing for example.

Besides, a temperature driven process may be part of another process, whereby the substrate can be subjected to temperature within that process. The provision of the dielectric layer on the upper surface may, for example, be done by a deposition process which requires exposure to temperature to facilitate the deposition process. Furthermore, the provision of the dielectric layer may itself cause a change of chemical nature of the first layer by damaging the upper surface.

Furthermore, provision of a further layer may also require exposure of the substrate to temperature to facilitate its provision. Deposition of another layer of material on or over the first layer, for example, may require this kind of temperature exposure.

In embodiments, this temperature process may be at a temperature ranging from 900° C. to 1100° C.

It may be beneficial to choose such a dielectric layer due to the fact that in situations where the first layer (50) is doped to a lower level of doping such as for example n-type doping of less than $5e16$ $cm^{-3}$, thanks to the choice of this dielectric layer, this lower level of doping can be unaffected, meaning that the doping level can be unchanged. By doping, it is meant that the doping element is homogeneously distributed throughout the layer. Furthermore, when this III-nitride semiconductor structure is used in the manufacturing of vertical power devices, then a change in the lower doping level of dopants could lead to a modified field condition under the gate. This would then lead to high electrical fields around the gate region during off-state and further lead to premature breakdown. This can further cause additional background doping in the upper layers that can be deposited to make up the vertical device, which would then have an impact on its electrical behavior.

In embodiments, this patterning process to form the first dielectric feature may comprise a wet etch process. In these embodiments, the patterning process may also comprise a lithographic process prior to the wet etch process. It may be beneficial to perform the wet etch process since it provides damage poor etching in comparison to dry etching, where the surface is bombarded by ions.

In embodiments, the patterning process to form the first dielectric feature may also comprise a dry etching process. In these embodiments, however, the method may further comprise performing a surface conditioning process after loading the substrate into the process chamber. The purpose of the surface conditioning is to remove the possible surface damage that may have been created by the dry etch due to ion bombardment. In this way, a damage poor surface can be obtained before forming the second layer of the monocrystalline III-nitride material.

The substrate can be loaded into a process chamber (300). This process chamber may be a chamber suitable for depositing a layer of a III-nitride material. In embodiments, this process chamber may be a Metal Organic Chemical Vapor Deposition (MOCVD) chamber.

The substrate can be exposed to a first gas mixture (400), thereby forming, on the upper surface (51), a second layer (52) of a monocrystalline III-nitride material by selective area growth (SAG). The second layer (52) of the monocrystalline III-nitride material can be formed on the exposed surface (51) of the first layer (50) of the monocrystalline III-nitride material. This exposed surface refers to the part of the upper surface (51) that is not covered by the patterned dielectric layer (10) as, for instance, shown in FIG. 2, part a.

The second layer (52) of the monocrystalline III-nitride material formed on the exposed surface (51) may, in embodiments, be of the same material as that of the first layer. In other embodiments, it may be of a different III-nitride material.

This first gas mixture comprises at least one Group III metal organic precursor gas, a nitrogen-containing gas and hydrogen gas at predetermined temperature. Depending on the number of Group III metal organic precursors chosen a layer of a binary, ternary or quaternary III-nitride material can be formed. In some embodiments, this at least one Group III metal organic precursor can be chosen such that a GaN layer is formed.

In embodiments, nitrogen containing gas may be $N_2$ and/or $NH_3$.

In embodiments the predetermined temperature may be a temperature given ranging from 700° C. to 1100° C.

It was determined that when two opposing sidewalls of the dielectric feature (10) are oriented parallel to one of the {11-20} crystal planes of the first layer (50), then upon formation of the second layer (52) of the monocrystalline III-nitride material a first trench (81) having tapered sidewalls (82) can be formed so that the crystal plane of the second layer parallel to the tapered sidewalls is one of {1-101} crystal planes. Tapered sidewalls refer to the fact that they are not situated at 90 degrees with respect to the bottom of the trench but at smaller angles than 90 degrees so that bottom of the trench is narrower than top of the trench.

This may be beneficial since the growth of the second layer (52) of the monocrystalline III-nitride material parallel to this crystal plane can offer a high-quality interface. This high-quality interface refers to having low defect density. In conventional processing, a dry etch process would be used to define this trench. The dry etch process would then damage the sidewalls of the trench due to the plasma exposure thus, leading to the creation of higher density of defects and higher density of dangling bonds due to for example Ga vacancy, nitrogen vacancy. Thanks to the present disclosure, the sidewalls may not be damaged, thus they are of high-quality such that the density of defects and of dangling bonds can be lower than would be the case if dry etch had been used.

Figure 3:
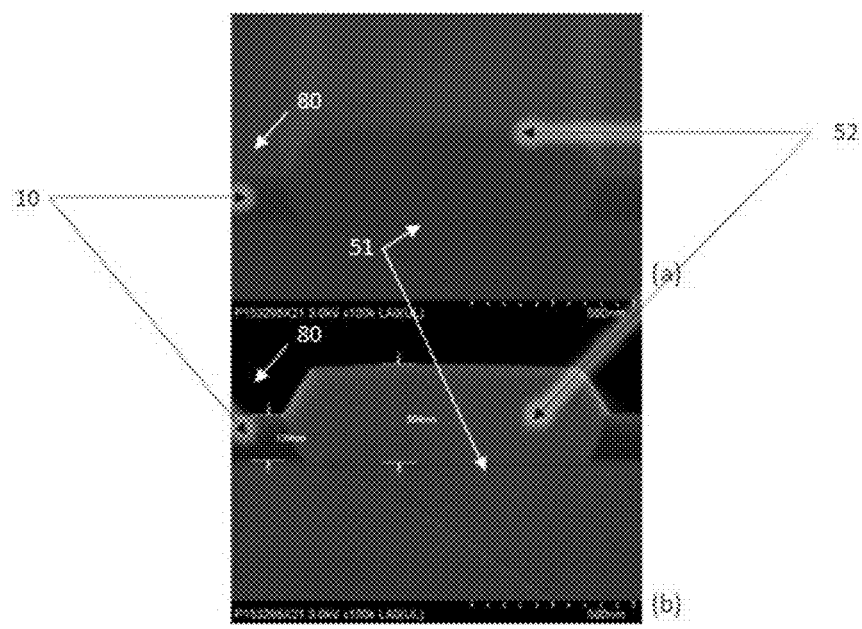
FIG. 3, parts a and b: Cross section Scanning Electron Microscopy (X-SEM) image of a III-nitride structure manufactured according to an embodiment of the first aspect of the present disclosure.

FIG. 3, parts a and b, is a Scanning Electron Microscopy image of an III-nitride structure manufactured according to an embodiment of the first aspect of the present disclosure. FIG. 3, part a, is a tilted cross section image, while FIG. 3, part b, is a cross section image. The second layer (52) of the monocrystalline III-nitride material grows on the upper surface (51) upon exposing the substrate to the first gas mixture and the trench (80) with tapered sidewalls is formed. This III-nitride structure can be obtained by a commercial MOCVD process. The III-nitride structure provided in FIG. 3, parts a and b, was obtained as follows as an example. Firstly, the temperature of the wafer is ramped from room temperature after loading into the reactor to the growth temperature, which is 1010° C. in this example. In order to protect the GaN surface in the template (surface 51), the ambient gas is set to $N_2$ and $NH_3$ with flow 190 slm and 50 slm, respectively. Secondly, the growth is achieved. This is done such that once the temperature reaches 1010° C. for example, the ambient gas is then switched to the ambient gas with $N_2$ and $H_2$ with flow 64 slm and 120 slm, respectively. The reaction gas is TMGa for Ga precursor and $NH_3$ for N with gas flow 100 sccm and 50 slm, respectively. $SiH_4$ gas is used for Si doping. The reactor pressure is 200 torr in both steps in this example. Depending on the second layer to be grown on the first layer, the dopant element can be adjusted by the use of a suitable dopant source. For example, in case of growing a p-type doped second layer, Cp2Mg may be used as the p-type dopant source.

In embodiments, the monocrystalline III-nitride material comprised in the second layer (52) grown on the upper surface (51) may be the same as the monocrystalline III-nitride material of the first layer (333).

This can have the benefit that no mismatch in lattice constant can be observed, thereby no strain may be induced in the grown second layer (52). Furthermore, there is no band-offset between (50) and (52), so that the motion of the electrons in the on-state may not be impeded (in other words a band-offset would increase $R_{on}$).

In some embodiments, this monocrystalline III-nitride material of the first layer (50) may be GaN.

In some embodiments, this monocrystalline III-nitride material of the second layer (52) may be GaN.

In embodiments, the doping level and doping type of the grown second layer (52) may also be the same as that of the first layer (50). In these embodiments, the dopant is an n-type dopant and the doping level in the first layer (50) ranging from 5e15 to 5e16 $cm^{-3}$.

In embodiments, the doping level and doping type of the grown second layer (52) may also be the same as that of the first layer (50) as well as the type of the III-nitride material. Thus, in some embodiments, monocrystalline III-nitride material of the first layer (50) and of the second layer (52) may be GaN and the doping type may be of n-type with a doping level ranging from 5e15 to 5e16 $cm^{-3}$.

When this III-nitride semiconductor structure according to such embodiments is used in the manufacturing of vertical power devices, it can be further beneficial in that the thickness of the first layer (50) would be increased due to the grown second layer (52) of the monocrystalline III-nitride material (52) being the same as the first layer (50) as is given in FIG. 2, part b. In these embodiments, the first layer (50) and the grown second layer (52) may be doped with an n-type dopant up to the same dopant level such that after completion of the device these two layers make up for the drift region of the device. In this way, the overall thickness of the drift region would increase, thereby increasing the breakdown strength of the device.

In embodiments, the upper surface (51), as provided, may be covered with an oxide layer (not shown in the figures). This oxide layer may be provided by a separate deposition process. Alternatively, the first layer (50) itself may be oxidized to provide this oxide layer. The benefit of this oxide layer can be that it can block the interaction of the dielectric layer with the first layer (50) of the monocrystalline III-nitride material during the provision of the dielectric layer, which can be used to form the patterned dielectric layer comprising the first dielectric feature (10). This opens up the process window for choosing a wide selection of dielectric layer without worrying about its interaction with the upper surface (51, 65) of the first layer (50). After patterning the dielectric layer to provide the patterned dielectric feature (10), this oxide layer may be removed, before the exposure of the substrate to the first gas mixture, from the areas that are not masked by the first dielectric feature (10). As such the patterned dielectric feature (10) comprises the patterned oxide layer and the patterned dielectric layer. By blocking the interaction, the first layer of the monocrystalline III-nitride material (50) may not be damaged, which might arise during the provision of the dielectric layer on the upper surface (51) and/or during its patterning to form the patterned dielectric feature (10). In this way, the doping level of the first layer (50) as referred in FIG. 2, parts a to c, of the monocrystalline III-nitride material may not be changed, thus avoiding the degradation of device characteristics, which could otherwise cause premature breakdown. Breakdown of the device is an example of the degradation of the device. The breakdown of the device can be dependent on the doping concentration in the drift region. Therefore, premature breakdown can happen if the doping concentration in the drift region is altered due to the process, which can be avoided in this embodiment thanks to the presence of the oxide layer. Thus, upon exposure to the first gas mixture, the second layer of the monocrystalline III-nitride material can be formed directly on the exposed parts of the upper surface (51), the exposed parts being the parts of the upper surface (51) being not covered by the patterned dielectric feature (10) comprising the patterned oxide layer.

The III-nitride semiconductor structure of the present disclosure may be used, in embodiments, in a method of manufacturing a vertical power device. The method may further comprise, forming in the process chamber, a third layer (335) of a monocrystalline Group-III nitride material, by selective area growth, on the second layer (52) of the monocrystalline III-nitride material, whereby the separation between the tapered sidewalls (82) of the trench (81) is increased. The growth of these layers may be done subsequently by the MOCVD process, without interruption.

This method of manufacturing the vertical power device can be a method comprising the steps required to manufacture the III-N semiconductor structure disclosed herein. Therefore, this method of manufacturing the vertical power device is to be understood as a method for manufacturing an intermediate in the fabrication of a vertical power device. This method for manufacturing the intermediate in the fabrication of a vertical power device, may thus, further comprise forming a gate electrode, a source electrode and a drain electrode.

A benefit in using the III-nitride semiconductor structure of the present disclosure can be in the manufacturing of the vertical power device since it provides a device that has stable device characteristics when a gate bias is applied. As the third layer of the monocrystalline Group-III nitride material is formed, the separation between the tapered sidewalls of the trench (80) may be increased. This indicates also that the sidewalls of the trench are not at 90 degrees with the bottom of the trench, but they widen as the growth proceeds upward. This trench may serve as a gate trench of the vertical power device, whereby the quality of the interface of the channel region with the gate is increased due to lowered density of interface defects since the sidewalls will form the channel of the device. This then increases the gate stability and the mobility of the channel, thereby improving the reliability of the vertical power device.

The third layer of the monocrystalline III-nitride material may, in embodiments, be a single layer (70). The thickness of this single layer can be adjusted as desired depending on the growth time. This single layer may be formed by selective area growth, whereby the substrate is exposed to a gas mixture similar to the first gas mixture.

In other embodiments, the third layer may be a plurality of layers of monocrystalline III-nitride material (335). This can be achieved by applying the step of exposure of the substrate to the first gas mixture in multiple steps such that further layers of monocrystalline III-nitride material can be formed sequentially. Each of the further layers may be made of the same or different III-nitride material. Each of the further layers may be doped or may not be doped. If they are doped, the doping type and/or the doping level may or may not be the same. In this way, the trench (80) grows further with the tapered sidewalls (82) moving away from each other in a direction, which is extending above from the surface of the first layer (50). When this plurality of layers is made from the same type of III-nitride material, but with differing doping type and/or doping level, the transitions between the layers of the plurality of layers can become clear. In such a case a differentiation between the layers would be visible from the difference associated with the doping level and/or the doping type. This kind of plurality of layers may be formed by selective area growth, whereby the substrate is exposed to the same gas mixture as the first gas mixture and the type and/or the doping level is varied going from one layer to another, which make up the plurality of layers. Depending on what the first layer is the trench that is formed may be a gate trench or a p-contact trench of the vertical power device.

Besides, this plurality of layers may, in other embodiments, be made from a different type of III-nitride material. In such a case, the substrate would be exposed to a different gas mixture such that it would comprise a different III-nitride precursor gas. Each layer involved in such plurality of layers may or may not be doped. In case they are doped, the doping type and/or the doping level may be different or the same.

In an exemplary embodiment as shown for instance in FIG. 2, part c, the third layer is a plurality of monocrystalline III-nitride material (335). In this exemplary embodiment, the top layer (70) of the plurality of layers (335) may be an n-type doped GaN layer having a doping level ranging from 1e18-5e19 $cm^{-3}$.

Figure 4:
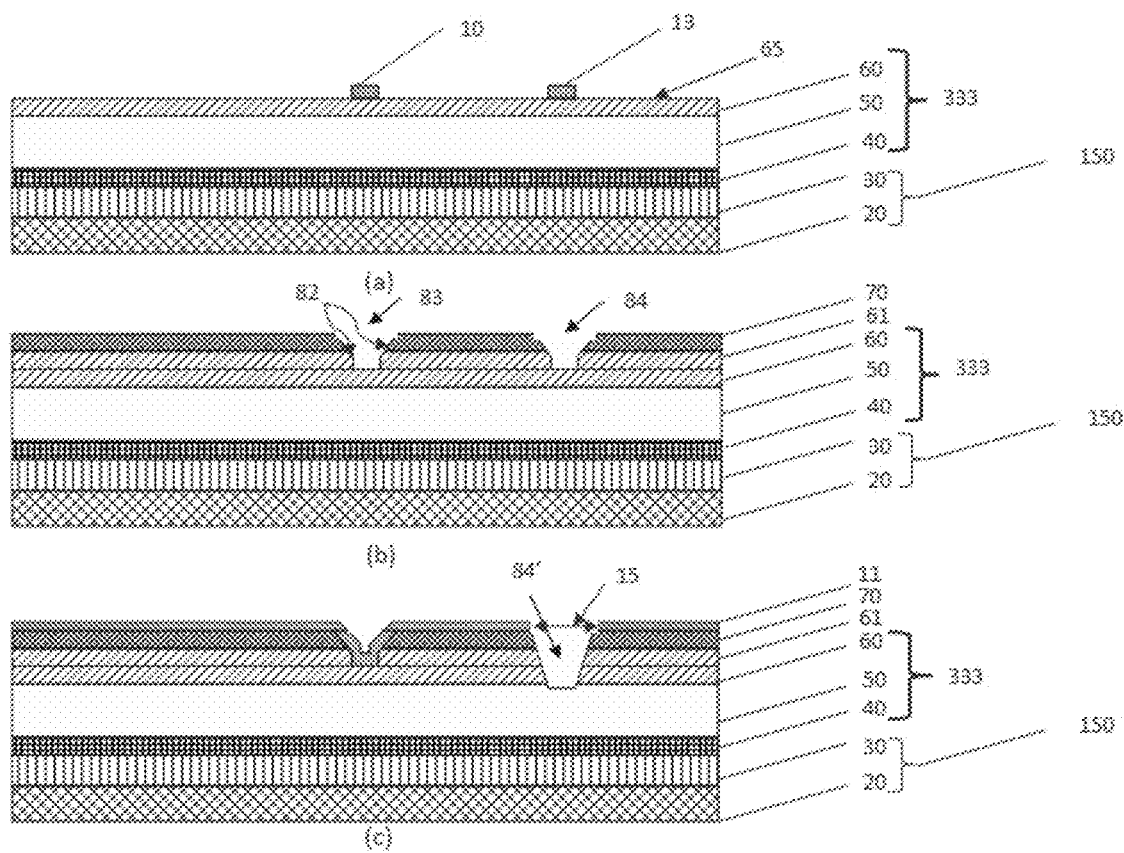
FIG. 4, parts a to c: show a schematic representation of an embodiment of the present disclosure, whereby two trenches are obtained by a combination of the regrowth process as disclosed in the first aspect with the removal process as disclosed in the second aspect.

In embodiments, the patterned dielectric layer comprises a second patterned dielectric feature (13) as shown, for instance, in FIG. 4, part a. This second patterned dielectric feature (13) may be the same as or different from the first patterned dielectric feature (10) in terms of its dimensions. Due to the presence of this second patterned dielectric feature (13), a second trench (84) may be formed when the substrate is exposed to the first gas mixture.

In embodiments, where the dimensions of the first patterned dielectric feature are the same as the second patterned dielectric feature, the two trenches (83,84) formed may then be identical.

The method may then further comprise removing the first (10) and the second dielectric feature (13) after formation of the third layer (70) of the monocrystalline III-nitride material. A conformal dielectric layer (11) may be provided on the substrate. This dielectric layer (11) may be patterned such that the tapered sidewalls and the bottom of the second trench (84) can be exposed through a first opening formed in the dielectric layer (11). This second trench (84) can be deepened by way of removal of the layer of the monocrystalline III-nitride material that is exposed through the opening when the substrate is exposed to a second gas mixture. This can lead to the formation of a deepened trench (84'). The deepening of the second trench (84) can be stopped any time depending on the removal time; i.e. depending on how long the substrate is exposed to the second gas mixture.

This second gas mixture can be different from the first gas mixture. The second gas mixture comprises a nitrogen-containing gas and hydrogen gas at a predetermined temperature.

In some embodiments, this second gas mixture consists of a nitrogen-containing gas and hydrogen gas at a predetermined temperature. This predetermined temperature may range from 700° C. to 1100° C. The nitrogen containing gas may be $N_2$ together with $NH_3$. The hydrogen containing gas may be $H_2$ gas. In the process, hydrogen containing gas is used for etching, whereas the nitrogen containing gas is used as ambient and to control the etch process.

In embodiments, this dielectric layer (11) may be a silicon carbide layer. Furthermore, it may be provided in-situ.

In particular embodiments relating to the manufacturing of a vertical power device, where the patterned dielectric layer comprises a second patterned dielectric feature (13) as shown in FIG. 4, part a, the first layer comprised in the substrate and the second layer (61) grown on it may be of the same III-nitride material having the same type and same level of dopant. This dopant type may, in these embodiments, be a p-type dopant having a doping level ranging from 1e18 to 5e19 $cm^{-3}$.

The third layer (70) grown may be of the same III-nitride material, however, with a different doping type and different doping level. Still in these embodiments, the doping type of the third layer (70) may be of n-type with a doping level ranging from 1e18 to 1e 19 $cm^{-3}$.

In embodiments, the first trench (83) formed may be a p-contact trench of the vertical power device and the second trench, which is the deepened (84'), may be a gate trench of the vertical power device. This gate trench may thus be deepened until its bottom reaches the n-drift region, which is typically defined by the III-nitride layer having n-type doping.

In exemplary embodiments, where the first layer is a stack of layers (333), these layers, going from top to bottom as in FIG. 4, part a, may be a p-type doped GaN layer (60) at a doping level ranging from 1e18 to 3e19 $cm^{-3}$, n-type doped GaN layer at a doping level ranging from 5e15 to 1e1 7 $cm^{-3}$ (50) and another n-type doped GaN layer (40) at a doping level ranging from 1e18 to 1e19 $cm^{-3}$. There may also be an interlayer (30) comprised in the substrate (150) for stress compensation in view of the stack of layers.

Figure 5:
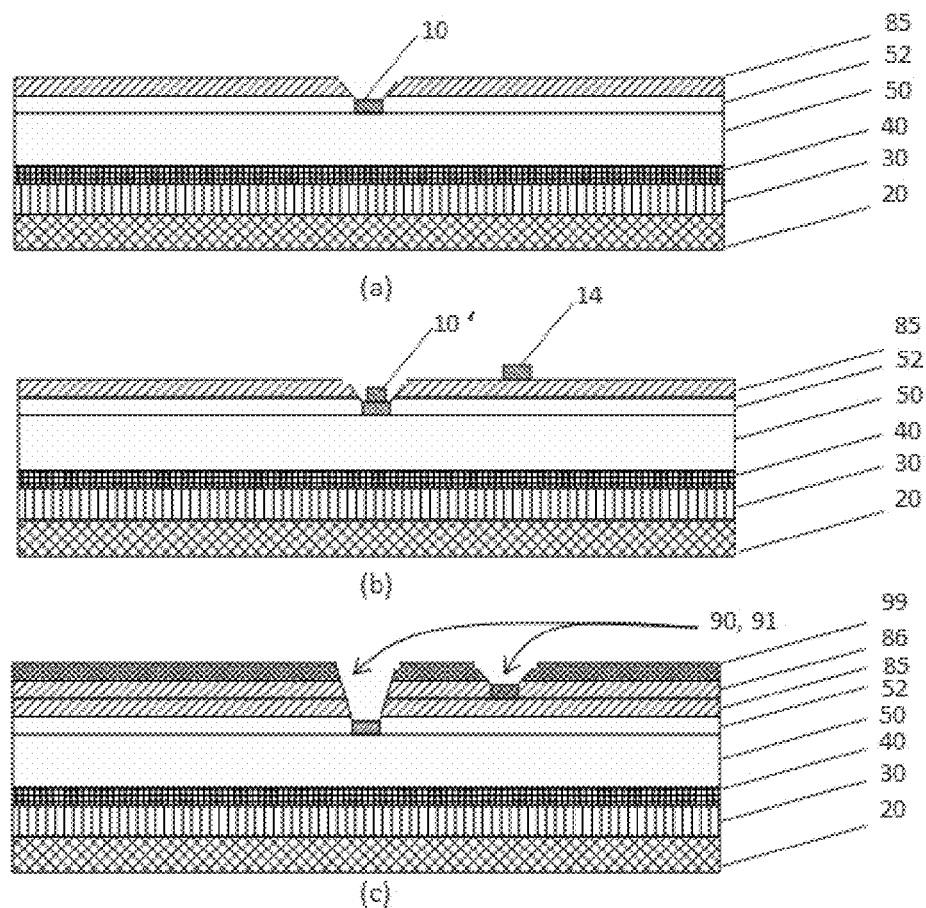
FIG. 5, parts a to c: show a schematic representation of an embodiment of the present disclosure, whereby two trenches are obtained by halting the regrowth process throughout the process.

In embodiments, the method of manufacturing the vertical device may further comprise halting the formation of the third layer (85) of the monocrystalline III-nitride material as shown, for instance, in FIG. 5, part a.

In embodiments, where the third layer is a single layer of monocrystalline III-nitride material, halting can be done after a certain thickness of that layer is reached.

In embodiments, where the third layer is a plurality of layers of monocrystalline III-nitride material, halting can be done after a certain type of doping and/or a certain doping level has been accomplished. Doing so exposes an intermediate layer (85) after which a third patterned dielectric feature (14) may be provided on the intermediate layer before resuming the formation of the layer of the monocrystalline III-nitride material as shown, for instance, in FIG. 5, part b. Thus, in exemplary embodiments, the vertical power device, which would be in intermediate stage of manufacturing after halting the formation may comprise, from top to bottom, a p-type doped GaN layer (85) at a doping level ranging from 1e18 to 3e19 $cm^{-3}$, an n-type doped GaN layer (52) corresponding to the second grown layer at a doping level of 5e15 to 1el 7 $cm^{-3}$, another n-type doped GaN layer (50) corresponding to the first layer at a doping level ranging from 5e15 to 1el 7 $cm^{-3}$, and an n-type doped GaN layer (40) at a doping level ranging from 1e18 to 1e19 $cm^{-3}$ There may also be an interlayer (30) comprised in the substrate (150) for stress compensation in view of the n-type doped GaN layer (40) as shown, for instance, in FIG. 5, part a.

Provision of the third patterned dielectric feature (14) may be obtained by depositing a conformal layer of a dielectric material on the intermediate layer. Following a patterning process comprising a lithography process and an etch process can lead to the formation of the third patterned dielectric feature (14). As a result of this process some dielectric material (10') may be left on the second patterned dielectric feature (10), which is not fully removed by the etch process.

To resume the formation of the layer of the monocrystalline III-nitride material may be beneficial since it leads to the creation of another trench in the same vertical power device using the method of the disclosure as shown in FIG. 5, part c. In this way two separate trenches (90, 91) having damage poor sidewalls can be obtained. These damage-poor sidewalls refer to the fact that they have lower density of interface defects, which then adds to the overall reliability of the device. In exemplary embodiments, the vertical power device as given, for instance, in FIG. 5, part c, may comprise, from top to bottom, an n-type doped GaN layer (99) at a doping level of 1e18 to 1e19 $cm^{-3}$, a p-type doped GaN layer (85, 86) at a doping level ranging from 1e18 to 3e19 $cm^{-3}$, which can be grown after resuming the growth, an n-type doped GaN layer (52) corresponding to the second grown layer at a doping level ranging from 5e15 to 1e17 $cm^{-3}$, another n-type doped GaN layer (50) corresponding to the first layer at a doping level ranging from 5e15 to 1el 7 $cm^{-3}$, and another n-type doped GaN layer (40) at a doping level ranging from 1e18 to 1e19 $cm^{-3}$ There may also be an interlayer (30) comprised in the substrate (150) for stress compensation in view of the n-type doped GaN layer (40) as shown, for instance, in FIG. 5, part c.

Considering the fact that the third patterned dielectric feature (14) can be provided at a later stage during the epi-growth upon halting of the formation, it can be expected that the depth of the trenches formed upon resuming the formation may eventually differ from one another. Consequently, by being able to make the trenches having different depths at different locations in the epi-stack allows for assigning different functions to these trenches. Thus, while one trench may become a gate trench, the other may become a p-contact trench of the vertical power device.

In embodiments, the intermediate layer (85) that is exposed after halting the formation may be doped with a p-type dopant and the third trench may be a p-contact trench.

In embodiments, the method of manufacturing the vertical power device may further comprise providing in-situ a conformal layer of a dielectric material on the layer of the monocrystalline III-nitride material. This dielectric layer on one hand can act like a passivation layer and on the other hand it can function as the gate dielectric of the device. The in-situ provision may be beneficial in that it may be provided without the need to unload the wafer from the process chamber, thereby not exposing it to ambient which otherwise could cause additional oxidation of the interface, thus increasing the defect density.

In embodiments, this dielectric may be a silicon nitride layer. In some embodiments, this layer is a layer of $Si_3N_4$.

In embodiments, the monocrystalline III-nitride material comprised in the second layer (52) grown on the upper surface (51) and/or the monocrystalline III-nitride material comprised in the first layer (50) may be a binary III-nitride material. In some embodiments, it may be GaN.

Figure 6:
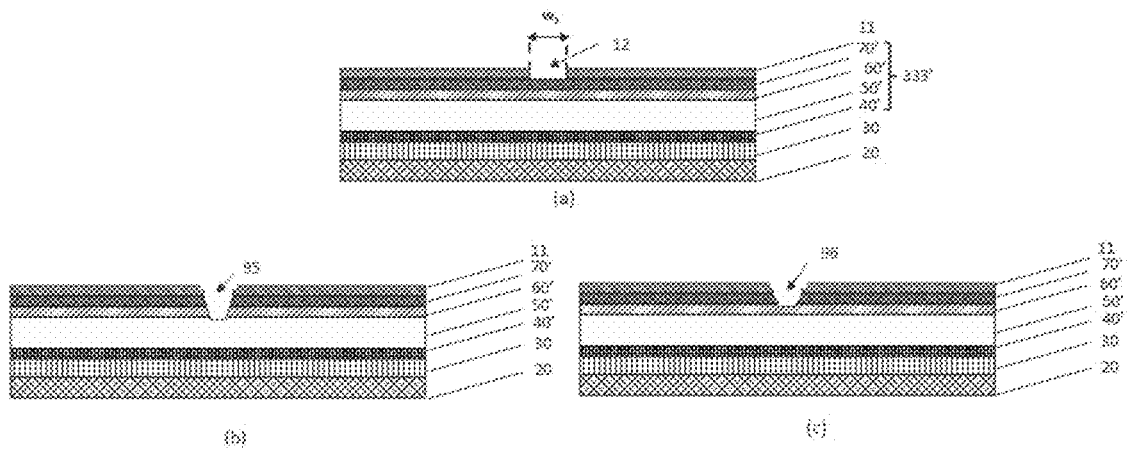
FIG. 6, parts a to c: show a schematic representation of process steps, in order, as used in an embodiment of the second aspect of the present disclosure.

FIG. 6, parts a to c, represents the schematics of a method according to a second aspect of the present disclosure.

The method comprises providing a substrate comprising a first layer (70') having an upper surface of monocrystalline III-nitride material).

In embodiments, the substrate may be a semiconductor substrate. In embodiments, the substrate (150) may comprise a semiconductor layer. In some embodiments, the substrate (150) may comprise a Si layer (20). In yet other embodiments, the substrate (150) may comprise a <111> oriented Si layer.

In yet other embodiments, the substrate may be an engineered substrate comprising the semiconductor layer. In such embodiments, the engineered substrate may comprise a poly AlN covered with an oxide layer. The Si layer may cover this oxide layer. In yet other embodiments, this Si layer may be a <111> oriented Si layer. Such an engineered substrate may be beneficial especially when the method is used for the manufacturing of III-nitride semiconductor structures to be used for the manufacturing of vertical power devices. The benefit may lie in the fact that such an engineered substrate can allow for growing thicker layers of epitaxial stack, which can be required for vertical power devices.

In embodiments, this first layer may be a single layer.

In embodiments, this monocrystalline III-nitride material of the first layer may be a binary, ternary or quaternary III-nitride material. In some embodiments, this monocrystalline III-nitride material may be GaN.

In embodiments, the first layer may be doped.

In embodiments, the first layer may be a stack (333') of layers (70', 60', 50', 40') stacked horizontally on top of each other. In embodiments, each layer in this stack of layers may be a layer of a monocrystalline III-nitride material. In these embodiments, this monocrystalline III-nitride material of each layer in this stack of layers may be a binary, ternary or quaternary III-nitride material. Still in such embodiments, this monocrystalline III-nitride material of each layer in this stack of layers may be the same material as one another or different from one another. In some embodiments, each layer of monocrystalline III-nitride material in this stack of layers may be the same and it may be GaN.

In embodiments, some or all of the layers of this layer stack may be doped. In such embodiments, the doping type may be the same or different in each layer of this stack of layers.

A patterned dielectric layer (11) is provided on the upper surface as shown, for instance, in FIG. 6, part a. This patterned dielectric layer (11) comprises a second opening (12). This second opening (12) exposes at its bottom a part of the upper surface of the first layer (70'). The substrate can be loaded into a process chamber and the substrate can be exposed to a second gas mixture. This second gas mixture comprises a nitrogen containing gas and hydrogen gas. As such, a part of the layer (70) exposed through the second opening (12) can be removed. The composition of this second gas mixture can be different than the composition of the first gas mixture. This leads to the fact that while formation of a layer of monocrystalline III-nitride material is taking place when the substrate is exposed to the first gas mixture, removal of a part of the layer of the monocrystalline III-nitride material can be achieved upon exposure of the substrate to the second gas mixture. In some embodiments, this second gas mixture consists of a nitrogen containing gas and hydrogen gas. The nitrogen containing gas may be $N_2$ together with $NH_3$. The hydrogen containing gas may be $H_2$ gas. In the process, hydrogen containing gas is used for etching, whereas the nitrogen containing gas can be used as ambient and to control the etch process. Furthermore, the temperature may also be relevant in changing the regime to move from formation to removal. Upon removal, two opposing sidewalls of the second opening can be oriented parallel to one of the {11-20} crystal plane of the first layer such that upon exposure to the second gas mixture the layer can be removed through the second opening, thereby forming a fourth trench (95, 96) with tapered sidewalls so that the crystal orientation parallel to the tapered sidewalls can be one of the {1-101} planes.

It was determined that a trench (95, 96) having sidewalls with lowered density of defects can also be created in an alternative way with this method. The sidewalls are not damaged as would be the case when such a trench had to be made by dry etching. Depending on how much time the exposure of the substrate to the second gas mixture continues, the depth of the trench formed can differ. As shown in FIG. 6, part b, and FIG. 6, part c, such trenches will have different depths.

In exemplary embodiments, the trench (95) in FIG. 6, part b, may represent a gate trench, while the trench (96) in FIG. 6, part c, may represent a p-contact trench. In these exemplary embodiments, the stack of layers (334) may be such as an n-type doped GaN layer (70) at a doping level of 1e18 to 1e19 $cm^{-3}$, a p-type doped GaN layer (60) at a doping level ranging from 1e18 to 3e19 $cm^{-3}$, an n-type doped GaN layer (50) corresponding to the second grown layer at a doping level of 5e15 to 1e17 $cm^{-3}$, and another n-type doped GaN layer (40) at a doping level of 1e18 to 1e19 $cm^{-3}$. There may also be an interlayer (30) comprised in the substrate (150) for stress compensation in view of the n-type doped GaN layer (40).

Figure 7:
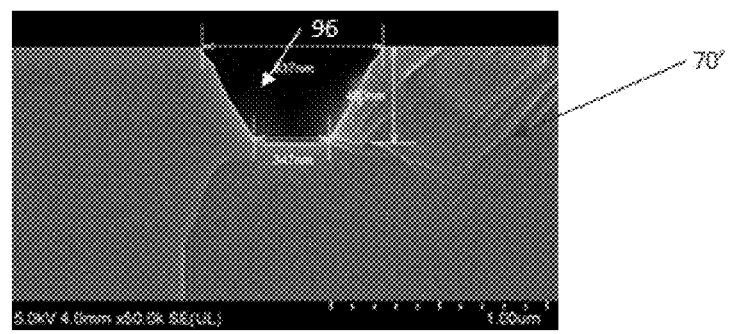
FIG. 7: Cross section Scanning Electron Microscopy (X-SEM) image of a III-nitride structure manufactured according to an embodiment of the second aspect of the present disclosure.

FIG. 7 shows a cross section SEM image of a III-nitride semiconductor structure manufactured according to the second aspect of the present disclosure. It can be observed that a trench (96) with tapered sidewalls can be formed in a GaN layer (70) as a result of the removal process upon exposure of the substrate to the second gas mixture.

The manufacturing of the III-nitride structure can be done in a process chamber such that the wafer temperature can be ramped from room temperature after loading into the process chamber to the growth temperature, which can be 1010° C. in this example provided in FIG. 7. In order to protect the GaN surface in the template, the ambient gases can be $N_2$ and $NH_3$ with flow 190 slm and 50 slm, respectively. Once the temperature reaches 1010° C. in this example, the ambient gas can then switched to the ambient gas with $N_2$, $H_2$ and $NH_3$ with flow 64 slm, 120 slm, and 50 slm, respectively in 1 minute. This condition can be maintained for 2 minutes further and then the temperature can be ramped down to room temperature. The ambient gas can be switched to $N_2$ and $NH_3$ (thus $H_2$-free) condition during the temperature ramping down.

In embodiments, this second opening (12) may have a width of w1. This width can be designed according to the needs and can be obtained by a patterning process of the dielectric layer. The patterned dielectric layer (11) may further comprise a third opening that has a width of w2. The width w2 may be different than the width w1.

It may be beneficial to have openings having differing widths because the process of material removal stops automatically when the two sidewalls meet. This can be due to the fact that it is a self-limiting process from which the final depth can be dependent on the width of the openings. Without wishing to be bound by theory, this can be related to the dynamics of the removal process and related to the mass transfer of the gases through the openings occurring during the removal process. As such, the depth obtained at the end of the removal process can be different. Thus, plurality of trenches having differing depths, or two trenches as in this embodiment, can be obtained during a single process step. This then increases the throughput of the process of the manufacture of the III-nitride semiconductor structure.

The removal process can be foreseen to be self-limiting and influenced by the size of the openings. By using optimal desorption conditions, such as pressure, concentration or partial pressures of gases and temperature, in the process chamber, desorption process can thus be further tailored. Once the two sidewalls meet the removal process will naturally stop such as shown, for instance, in FIG. 9, part a. Therefore, the final depth of the trenches can thus be carefully controlled by the size of the openings in the patterned dielectric layer. This can be exploited to create damage poor trenches with different depths. Thus, by providing different sizes for the openings in the patterned dielectric layer, it can allow to have the removal process stop at a different depth with respect to each trench formed. If the removal process is timed in such a way that it is purposefully stopped before it can naturally stop, then the final trenches can be defined by tapered sidewalls converging with the bottom of the trench such that the bottom of the trench can be parallel with respect to the upper surface of the patterned dielectric layer (11).

Figure 8:
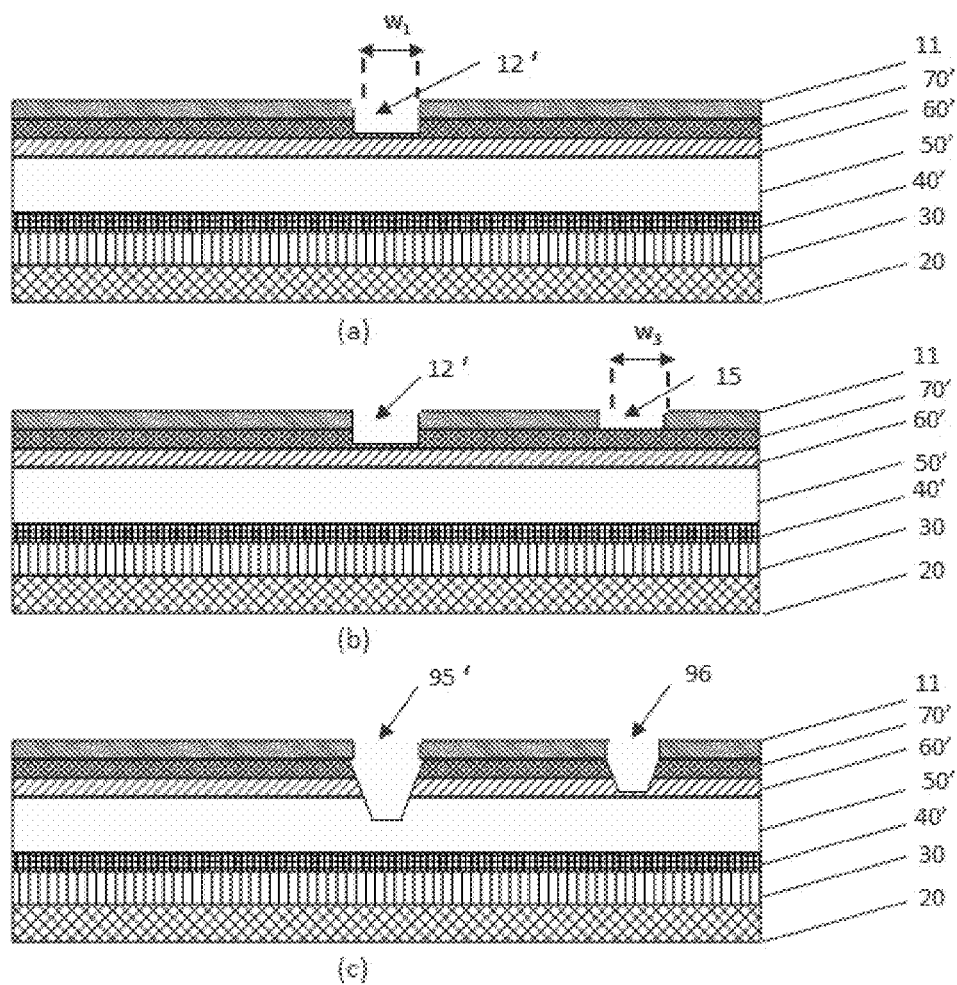
FIG. 8, parts a to c: show a schematic representation of an embodiment of the present disclosure according to the second aspect.

In alternative embodiments, before loading the substrate into the process chamber, partial etching may be performed through the second opening (12). This helps to remove some of the material, thereby partially recessing the first layer as shown, for instance, in FIG. 8, part a, leading to the formation of trench (12'), whereby no change is made to the width w1 of the second opening (12). This partial recessing may damage the first layer especially if it is done by a dry etching process; however, the subsequent removal done by the exposure to the second gas mixture can remove the damaged regions. Thereafter, a fourth opening (15) may be formed on the patterned dielectric layer having a width w3 as shown in FIG. 8, part b. This width w3 of the fourth opening (15) may be the same or different than the width w1 of the second opening (12). Even in embodiments where width w3 would be the same as the width w1, due to the prior partial etching done, the final depth of the trenches obtained (95', 96) can be different as shown in FIG. 8, part c. This removal process can be applied an arbitrary number of times to create damage poor trench regions with different final depths. Thus, it can be beneficial that plurality of trenches having differing depths, or two trenches (95', 96) as in this particular embodiment, can be obtained during a single process step that achieves the removal. This then also increases the throughput of the process of the manufacture of the III-nitride semiconductor structure.

Figure 9:
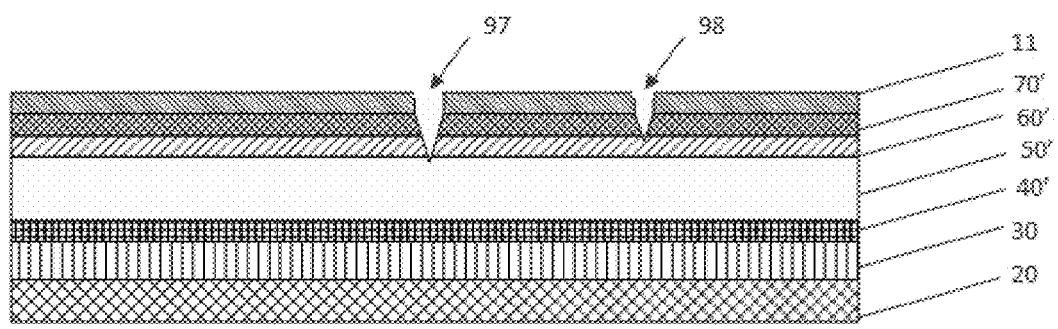
FIG. 9, parts a and b: show a schematic representation of an embodiment of the present disclosure.
Figure 9:
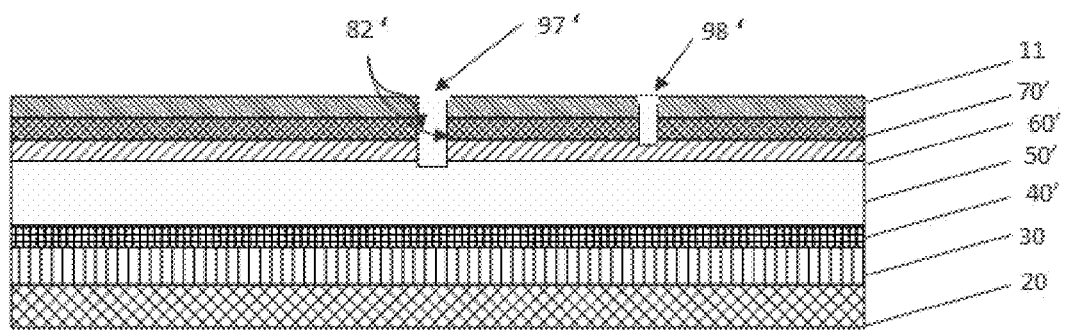

In embodiments, where the removal process is performed, the method may further comprise performing a wet etch process comprising tetramethylammonium hydroxide (TMAH), thereby making the tapered sidewalls substantially perpendicular (82') with respect to the upper surface as shown in FIG. 9, part b. Substantially perpendicular in this context refers to the fact that the angle between the sidewalls and the bottom of the trench after exposure to TMAH is about 90 degrees. For certain applications, where this III-nitride semiconductor structure will be used, it may not be beneficial to have trenches with tapered sidewalls and/or having a sharp bottom due to the self-limiting nature of the removal process. Use of TMAH may, thus, be beneficial due to the fact that the tapered sidewalls can be straightened substantially. Furthermore, the trench depth after exposure to TMAH will not change, which may be beneficial for applications that need to have a well-defined trench depth but with substantially straight sidewalls.

In embodiments, manufacturing the III-nitride semiconductor structure according to the foregoing embodiments referring to the removal process may be comprised in a method of manufacturing a vertical power device. In this vertical power device, the first layer may comprise plurality of layers of a monocrystalline III-nitride material that are stacked horizontally on top of each other. Thus, in an exemplary embodiment, stack of layers (334) stacked horizontally on top of each other that make up the first layer may be made of, going from top to bottom, an n-type doped layer of monocrystalline III-nitride material at a doping level ranging from 1e18 to 1e19 $cm^{-3}$(70), a p-type doped layer of a monocrystalline III-nitride material at a doping level ranging from 1e18 to 3e19 $cm^{-3}$ (60), an n-type doped layer of monocrystalline III-nitride material at a doping level ranging from of 5e15 to 1e17 $cm^{-3}$ (50) and another n-type doped layer of monocrystalline III-nitride material at a doping level ranging from 1e18 to 1e19 $cm^{-3}$(40)

In embodiments, there may be an intermediate layer (30) comprised in the substrate (150) for the purpose of enhancing nucleation and/or stress compensation with this stack of layers (334) as shown, for instance, in FIG. 6, part c.

What is claimed:

1. A method of manufacturing a vertical power device comprising:
   manufacturing an III-nitride semiconductor structure according to a method comprising:
   providing a substrate comprising a first layer having an upper surface of monocrystalline III-nitride material;
   providing, over the upper surface, a patterned dielectric layer comprising a first dielectric feature;
   loading the substrate into a process chamber;
   exposing the substrate to a first gas mixture comprising at least one Group III-metal organic precursor gas, a nitrogen-containing gas and hydrogen gas at a predetermined temperature, thereby forming, on the upper surface, a second layer of a monocrystalline III-nitride material by area selective growth,
   wherein two opposing sidewalls of the first dielectric feature are oriented parallel to one of {11-20} crystal planes of the first layer such that upon formation of the second layer of the monocrystalline III-nitride material a first trench having tapered sidewalls is formed so that the crystal plane of the second layer parallel to the tapered sidewalls is one of {1-101} crystal planes; and
   forming, in the process chamber, a third layer of a monocrystalline III-nitride material, by selective area growth, on the second layer of the monocrystalline III-nitride material, whereby a separation between the tapered sidewalls of the trench is increased.

2. The method according to claim 1, wherein the second layer of the monocrystalline III-nitride material grown on the upper surface and the first layer have a same level of n-type doping.

3. The method according to claim 1, wherein the patterned dielectric layer comprises a second dielectric feature, whereby a second trench is formed upon exposure of the substrate to the first gas mixture, and the method further comprises:
   removing the first dielectric feature and the second dielectric feature after formation of the third layer of the monocrystalline III-nitride material;
   providing conformally a dielectric layer on the substrate;
   patterning the dielectric layer such that the tapered sidewalls and a bottom of the second trench is exposed through a first opening formed in the dielectric layer, so that upon exposing the substrate to a second gas mixture different from the first gas mixture, the first gas mixture comprising a nitrogen-containing gas and hydrogen gas at a predetermined temperature, the second trench is deepened by removing the layer of the monocrystalline III-nitride material exposed through the opening.

4. The method according to claim 1, wherein the method further comprises halting the formation of the third layer of the monocrystalline III-nitride material, thereby exposing an intermediate layer and thereafter, providing a third patterned dielectric feature on the intermediate layer before resuming the formation of the third layer of the monocrystalline Ill-nitride material,
   wherein two opposing sidewalls of the third patterned dielectric feature are oriented parallel to one of {11-20} crystal planes of the intermediate layer such that upon resuming the formation of the plurality of layers a third trench having tapered sidewalls is formed so that crystal orientation along the tapered sidewalls is one of {1-101} planes.

5. The method according to claim 1, wherein the method further comprises providing, in-situ on the layer of a monocrystalline III-nitride material, a conformal layer of a dielectric material.

6. The method according to claim 1, wherein the monocrystalline III-nitride material comprised in the second layer grown on the upper surface and the monocrystalline III-nitride material comprised in the first layer is GaN.

7. The method according to claim 1, wherein the monocrystalline III-nitride material comprised in the second layer grown on the upper surface or the monocrystalline III-nitride material comprised in the first layer is GaN.

8. The method according to claim 1, wherein the monocrystalline III-nitride material comprised in the second layer grown on the upper surface is the same as the monocrystalline III-nitride material of the first layer.

9. The method according to claim 1, wherein the upper surface of monocrystalline III-nitride material is covered with an oxide layer, the method further comprising removing the oxide layer before the exposure to the first gas mixture, thereby allowing the formation of the second layer of the monocrystalline III-nitride material on an exposed part of the upper surface.

10. The method according to claim 1, wherein the provision of the patterned dielectric layer comprises:
    providing a dielectric layer over the upper surface; and
    performing a patterning process, thereby forming the first patterned dielectric feature, wherein the dielectric layer is chosen such that the first layer of monocrystalline III-nitride material is chemically unaffected when the substrate undergoes a temperature driven process so that a doping level of the first layer of III-nitride material remains substantially the same.

11. The method according to claim 10, wherein the patterning process comprises a wet etching process.

12. The method according to claim 10, wherein the patterning process comprises a dry etching process and the method further comprises performing a surface conditioning process after loading the substrate into the process chamber.

13. A method of manufacturing a vertical power device comprising manufacturing an III-nitride semiconductor structure according to a method comprising:
    providing a substrate comprising a first layer having an upper surface of monocrystalline III-nitride material;
    providing, on the upper surface, a patterned dielectric layer comprising a second opening, the second opening exposing, at its bottom, a part of the upper surface;
    loading the substrate into a process chamber; and
    exposing the substrate to a second gas mixture comprising a nitrogen-containing gas and hydrogen gas at a predetermined temperature, thereby removing a part of the first layer exposed through the second opening,
    wherein two opposing sidewalls of the second opening are oriented parallel to one of {11-20} crystal planes of the first layer such that upon exposure to the second gas mixture the first layer is removed through the second opening, thereby forming a fourth trench with tapered sidewalls so that crystal orientation parallel to the tapered sidewalls is one of {1-101} planes, and
    wherein the first layer of monocrystalline III-nitride material comprises a plurality of layers of a monocrystalline III-nitride material being stacked horizontally on top of each other.

14. The method according to claim 13, wherein the second opening has a width w1 and wherein the patterned dielectric layer comprises a third opening having a width w2, w2 being different than w1.

15. The method according to claim 14, wherein the second opening has a width w1 and the method further comprises, before loading the substrate into the process chamber:
    performing a partial etching;
    thereafter forming, on the patterned dielectric layer, a fourth opening having a width w3, wherein w3 is the same or different than w1.

16. The method according to claim 13, wherein the method further comprises performing a wet etch process comprising tetramethylammonium hydroxide, thereby making the tapered sidewalls substantially perpendicular with respect to the upper surface.

* * * * *